United States Patent [19]

Snyder, Jr. et al.

[11] 4,224,461
[45] Sep. 23, 1980

[54] UNGROUNDED THREE WIRE THERMOCOUPLE

[75] Inventors: Edmund W. Snyder, Jr., Ballston Spa; Alexander J. Smolenski, Scotia, both of N.Y.

[73] Assignee: General Electric Company, Schenectady, N.Y.

[21] Appl. No.: 934,953

[22] Filed: Aug. 18, 1978

[51] Int. Cl.² .............................................. H01L 35/02
[52] U.S. Cl. .................................. 136/233; 73/359 R; 136/230; 136/232; 310/54; 310/55
[58] Field of Search ............... 73/359 R; 136/230, 232, 136/233; 310/54, 55

[56] References Cited

U.S. PATENT DOCUMENTS 4,131,756 12/1978 Smith ............................... 136/230

FOREIGN PATENT DOCUMENTS 1386837 3/1975 United Kingdom ................... 136/230

Primary Examiner—Leland A. Sebastian
Attorney, Agent, or Firm—John F. Ahern

[57] ABSTRACT

An ungrounded three wire thermocouple has two thermocouple wires and a ground wire assembled in a metal cylindrical housing which can be immersed in a fluid whose temperature is to be monitored by the thermocouple. The thermocoupled housing may have an insulation surface to electrically insulate the housing from the equipment being monitored and to be isolated from the ground or potential of the equipment being monitored. The ground wire in the thermocouple assembly can be connected to the instrument grounds of the instrumentation which measures or otherwise utilizes the output of the thermocouple wires. The thermocouple is disclosed as being immersed in either a liquid or a gaseous cooling medium. A second embodiment of the invention uses two spaced three wire thermocouples mounted on an insulation support and are exposed to the flow of a gaseous medium whose temperature is to be monitored.

11 Claims, 8 Drawing Figures

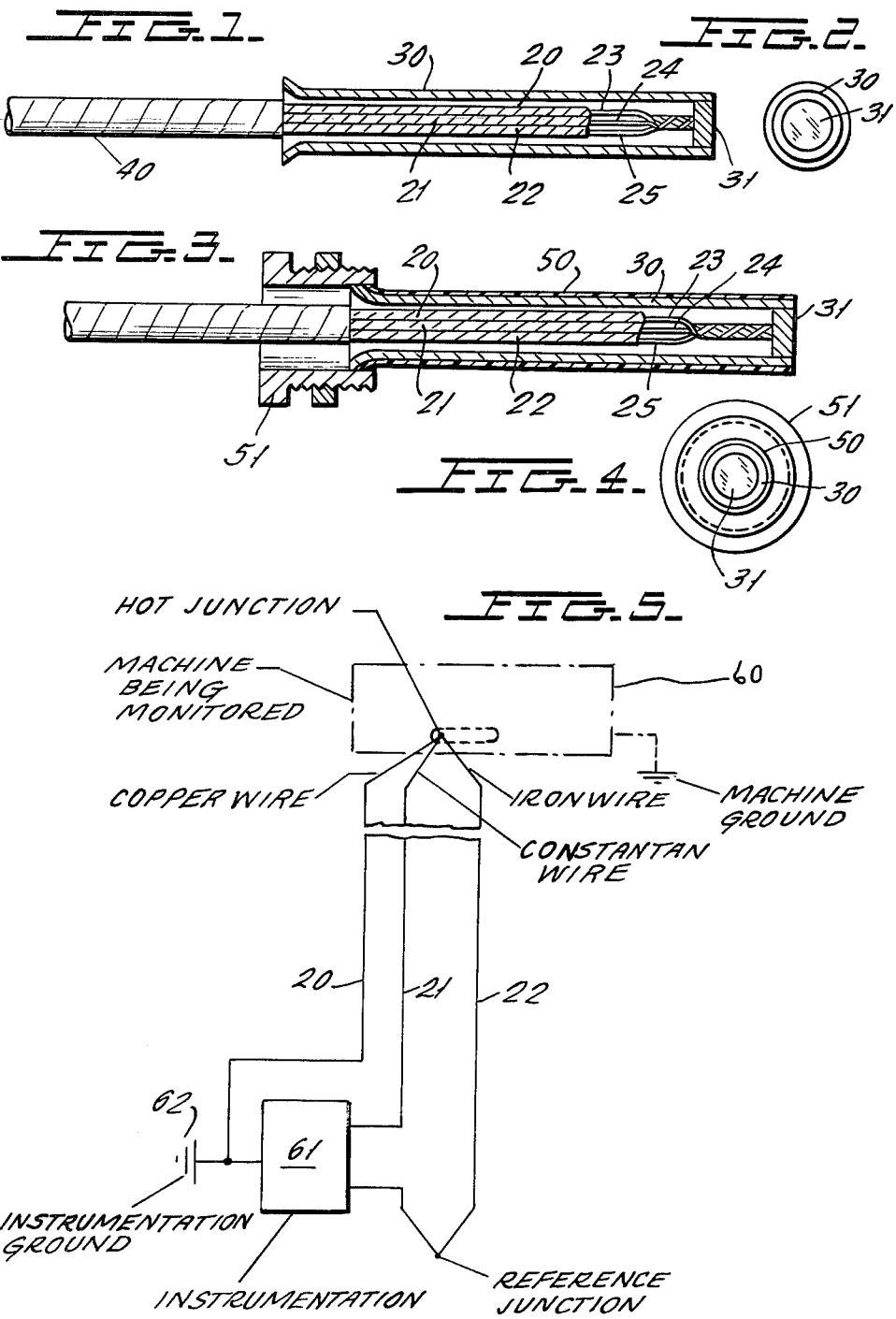

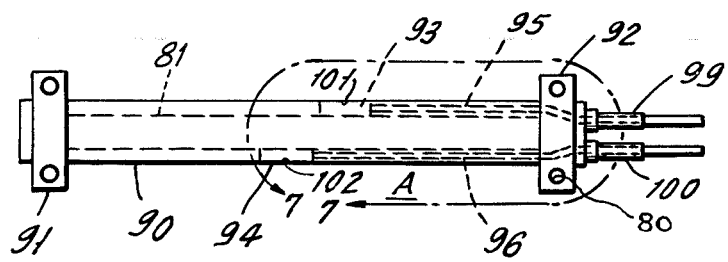

UNGROUNDED THREE WIRE THERMOCOUPLE

BACKGROUND OF THE INVENTION

This invention relates to a novel thermocouple construction and more specifically relates to a three wire thermocouple which is fixed to a housing adapted to be isolated from the ground of the equipment in which the thermocouple is mounted and wherein the third wire of the thermocouple can be used to ground the thermocouple junction to an instrument ground.

Two wire thermocouples are well known in the art and are commonly used to monitor the temperature of fluids and solids in various applications.

By way of example, two wire thermocouples are commonly used to monitor temperatures in gas cooled dynamoelectric machines of the type shown in U.S. Pat. No. 3,091,710 dated May 28, 1973 in the name of Shartrand et al and are also used for monitoring the temperature of the liquid cooling medium used for cooling stator or rotor windings in applications such as those shown in U.S. Pat No. 3,112,415 dated Nov. 26, 1963 in the name of Bahn et al or U.S. Pat. No. 3,693,036 dated Sept. 19, 1972 in the name of Schmitt.

The standard two wire thermocouple used in equipment of the type described above is normally arranged so that the junction exposed to the fluid whose temperature is measured is also electrically connected to the equipment ground. The equipment ground of dynamoelectric machines and in other applications frequently exhibits considerable noise as compared to the relatively noise-free ground which is available in the monitoring instrumentation and controls to which the thermocouple output is connected. It would be very desirable to be able to obtain an output signal from a thermocouple which is free of the background noise associated with the ground of the equipment being monitored.

SUMMARY OF THE INVENTION

In accordance with the present invention, a novel three wire thermocouple is provided wherein a third wire is added to the normal thermocouple pair. The third wire is a wire of low resistivity such as copper, and with extensions of the two thermocouple wires to the instrumentation to which they are connected. The three wires are all connected at the thermocouple junction, but are electrically insulated from one another. The third wire may then be connected to the instrument ground so that the junction is grounded to the solid instrument ground which is relatively free of background noise.

The exterior of the thermocouple housing is covered with a suitable insulation material to prevent the electrical connection of the junction to the equipment being monitored and thus preventing the connection of the junction to the undesirable and relative noisy ground of the equipment being monitored.

By allowing the three wire thermocouple to be connected to a ground which is outside of the equipment being monitored, it becomes possible to eliminate all ground loop current problems which can exist when the junction is at a ground which is different from the instrument ground. Thus, there is a better tie for factory instrumentation which leads to computers or thermocouple readout devices.

The thermocouple structure of the invention is contained within an elongated conductive housing which is mechanically strong and completely encloses the thermocouple wires. Thus, the device can stand more abuse than the conventional thermocouple and is capable of numerous mounting configurations.

The novel three wire thermocouple can be used by itself or can be used in pairs where it is desired to obtain a redundant output or the average output of a plurality of thermocouples for conventional control purposes. When the thermocouple housing can be mounted on an insulation support, it is unnecessary to provide the insulation coating on the conductive thermocouple cylindrical housing.

BRIEF DESCRIPTION OF THE DRAWINGS

FIG. 1 is a partial cross-sectional view taken along the axis of a three wire thermocouple constructed in accordance with the present invention.

FIG. 2 is an end view of FIG. 1.

FIG. 3 illustrates the assembly of FIG. 1 after the formation of an insulation coating on the outer surface of the conductive housing and further illustrates a mounting member for the assembly.

FIG. 4 is an end view of FIG. 3.

FIG. 5 is a circuit diagram of the novel ungrounded three wire thermocouple of the present invention.

FIG. 6 illustrates two thermocouples of the type shown in FIGS. 1 and 2 fixed on an insulation support.

FIG. 7 is an enlarged view of the portion of FIG. 6 encircled by arrow 'A'.

FIG. 8 is a top view of a portion of FIG. 7 to illustrate a slot cutout in FIG. 7.

DETAILED DESCRIPTION

Referring to FIGS. 1 and 2, the thermocouple of the invention consists of three wires 20, 21 and 22 which are copper, constantan and iron, respectively. Copper wire 20 may be a number 20 AWG solid wire. Each of wires 20, 21 and 22 are covered with respective insulation sheaths which may carry different colored tracers such as green, red and white, respectively. The insulation sheaths may be a film or Kapton type H film. Kapton is a registered trademark of E. I. Dupont Company which describes a polyimide type insulation film. Any other equivalent desired insulation material can be used. The three wires 20, 21 and 22 are stripped of insulation at the last quarter inch of their length as shown by wire ends 23, 24 and 25, respectively. The insulated wires 20, 21 and 22 are twisted together and are inserted into a soft copper elongated cylinger 30. Tube 30 may have a length of about 1 inch, an outer diameter of about 0.1 to 1 inch and a thickness of about 0.008 inch. The right-hand end of the cylinder 30 and the twisted wires 23, 24 and 25 are dipped in solder to form a solder mass 31 which covers about one quarter inch of the length from the end of tube 30 and the wires 20, 21 and 22, respectively. The solder mass 31 interconnects the wires and the copper tube 30 thermally and electrically. Although wires 23, 24 and 25 are shown twisted to emphasize the electrical junction they may merely be imbedded in solder mass 31 with advantages in ruggedness.

The individual wires 20, 21 and 22 are formed together into a single cable 40, as seen in FIG. 1, covered by a common high temperature fiberglass outer covering which may have a black tracer. The individual wires 20, 21 and 22 are directly connected to the desired terminal or to the reference junction, as desired. No intermediate wires are required.

The assembled three wire thermocouple may be used in the form shown in FIGS. 1 and 2 or, if desired, an insulation coating can be applied to the outer surface of tube 30 so that it can be fixed to conductive equipment without being electrically connected to the equipment. FIGS. 3 and 4 illustrate the assembly of FIGS. 1 and 2 with an insulation sheath 50 applied to the outer surface of tube 30. The insulation covering 50 can be of any desired type such as an irradiated polyolefin shrink tubing; an epoxy dip; an aluminum oxide spray coating or the like. A preferred coating is a flame sprayed aluminum oxide powder which is applied to the copper tube 30 at a temperature of about 3000° F. As this material is deposited, it forms a homogeneous, continuous insulation film which follows the exact configuration of the outer surface of tube 30 and provides excellent electrical insulation with no electrical leakage while also providing good thermal conductivity from the exterior environment to copper tube 30 and the thermocouple junction. One such coating is available as "ROKIDE" coating from the Norton Company of Worcester, Mass.

FIGS. 3 and 4 also show a threaded mounting bushing 51 fixed to the outwardly flared end of the copper tube 30.

FIG. 5 is a circuit diagram illustrating the use of the novel three wire ungrounded thermocouple of FIGS. 3 and 4. In FIG. 5, the machine being monitored is schematically illustrated in dotted lines, and this machine may be the stator or rotor winding of a dynamoelectric machine which is gas cooled or liquid cooled. The assembly of FIGS. 3 and 4 is schematically illustrated as being fixed in the machine being monitored and is shown by the dotted rectangle 60 in FIG. 5 and forms the hot junction of the thermocouple measuring system. Note that because of the insulation sheath 50 on the three wire thermocouple, the thermocouple will not be connected to the machine ground of the machine being monitored.

The thermocouple output cable is then taken to the instrumentation 61 and the output of the thermocouple formed between the constantan wire and iron wire relative to the reference junction produces a suitable output for the instrumentation 61. The instrumentation 61 has its own instrument ground 62 which is a relatively noise-free ground compared to the ground 60 of the machinery being monitored, and the copper wire 20 extends from the hot junction and is connected directly to the instrumentation ground 62. Thus the hot junction is grounded at the instrument ground 62 and all ground loop problems which might exist between grounds 62 and the machine ground are eliminated. Moreover, a noise-free signal is produced by the thermocouple pair 21 and 22 as compared to the noise which would be present in the signal if the junction were grounded to the machine ground.

In the embodiments of FIGS. 3 and 4, an insulation coating 50 is shown on the copper tube 30. This copper tube is then inserted, for example, in the water flow path of a water cooled winding of a dynamoelectric machine. The insulating coating 50 provides electrical insulation to the main body of the thermocouple and prevents grounding to the equipment being monitored.

In the embodiments of FIGS. 6 and 7, there is illustrated therein a metallic sheath 90 which has mounting clamps 91 and 92 at its opposite ends to enable it to be insulatingly mounted in the flow path of a gas such as hydrogen which might be used for the cooling of dynamoelectric machines or the like. The sheath might have a length, for example, of about 11 inches, a height of about 1½ inches, and a thickness of about ⅛ of an inch. The upper and lower margins of the sheath 90 are then suitably slotted to receive two identical three wire ungrounded thermocouple assemblies 93 and 94 which are identical to one another and which have their output conductor bundles 95 and 96, respectively, extending to one end of the sheath and then through bushings 97 and 98, respectively, and through teflon sleeves 99 and 100, respectively. An insulating member 81 is inserted within sheath 90 and separates thermocouples 93 and 94 physically and electrically. The output conductors of the thermocouples 93 and 94 then extend to suitable instrumentation as shown, for example, in FIG. 5. Two thermocouples are provided either for redundancy, or to provide an output of two devices which can be averaged.

Each of thermocouples 93 and 94 may be identical to those shown in FIGS. 1 and 2.

Slot cutouts 101 and 102 are formed at locations centrally aligned with the thermocouple housings 93 and 94, respectively, to permit soldering, brazing, or other suitable means for affixing the thermocouples in intimate electrical, mechanical and thermal contact with sheath 90 which is in thermal equilibrium with the cooling gas. The electrical contact between thermocouples 93 and 94 is therefore through sheath 90.

Typically such a dual thermal thermocouple sheath member can be mounted in insulating blocks through holes 80 in brackets 92 both on the hot side and on the cold side of the cooling gas cooler. The outputs of the two thermocouples 93 and 94 are then processed in a manner well known to those skilled in the art, except that the grounds for the two thermocouples are solid grounds which may be made directly to the instrument casings.

Although there has been described a preferred embodiment of this invention, many variations and modifications will now be apparent to those skilled in the art. Thus for example while iron-constantan thermocouples have been used for descriptive purposes other thermoelectric pairs of dissimilar metals may be used, depending on the temperature and the contact potential desired. Therefore, this invention is to be limited, not by the specific disclosure herein, but only by the appended claims.

What is claimed is:

1. A three wire thermocouple comprising in combination:
   a pair of elongated insulated thermocouple wires;
   a highly conductive insulated ground wire;
   a hollow conductive cylinder adapted to be exposed to the medium to be monitored by said thermocouple;
   one end of each of said pair of thermocouple wires and of said ground wire being disposed within and connected to one another and to said hollow conductive cylinder.

2. A temperature monitoring system including apparatus to be monitored; an instrumentation system having an electrical ground which is electrically isolated from the body of said apparatus; and a three wire thermocouple; said three wire thermocouple comprising, in combination:
   a pair of elongated insulated thermocouple wires;
   a highly conductive insulated ground wire;

a hollow conductive cylinder adapted to be exposed to the medium to be monitored by said thermocouple;

one end of each of said pair of thermocouple wires and of said ground wire being disposed within and connected to one another and to said hollow conductive cylinder;

said hollow conductive cylinder being mounted within said apparatus and being electrically insulated therefrom; said pair of thermocouple wires being connected to said instrumentation system; said ground wire being connected to said electrical ground of said instrumentation system.

3. The temperature monitoring system of claim 1 or 2 wherein said pair of thermocouple wires are soldered to the interior of said conductive cylinder.

4. The temperature monitoring system of claim 3 which includes an insulation sheath over the outer surface of said conductive cylinder.

5. The temperature monitoring system of claim 4 wherein said insulation sheath is alumina.

6. The temperature monitoring system of claim 1 or 2 wherein said pair of thermocouple wires are of iron and constantan, respectively.

7. The temperature monitoring system of claim 2 which includes a second thermocouple identical to said thermocouple; said thermocouples being mounted in respective spaced locations on a common insulation support and affixed to a conducting sheath surrounding said thermocouples.

8. The temperature monitoring system of claim 7 wherein said sheath is disposed in the flow path of a cooling gas.

9. The temperature monitoring system of claim 1 or 2 wherein said thermocouple is mounted in the path of a cooling fluid.

10. The temperature monitoring system of claim 1 or 2 which includes an insulation sheath over the outer surface of said conductive cylinder.

11. The temperature monitoring system of claim 10 wherein said insulation sheath is alumina.

* * * * *